(12) United States Patent
Okonogi et al.

(10) Patent No.: US 8,674,455 B2
(45) Date of Patent: Mar. 18, 2014

(54) SEMICONDUCTOR DEVICE

(76) Inventors: Kensuke Okonogi, Chuo-ku (JP);
Kazuhiro Nojima, Chuo-ku (JP);
Kiyonori Oyu, Chuo-ku (JP)

( * ) Notice: Subject to any disclaimer, the term of this patent is extended or adjusted under 35 U.S.C. 154(b) by 250 days.

(21) Appl. No.: 13/334,964

(22) Filed: Dec. 22, 2011

(65) Prior Publication Data

US 2012/0161219 A1 Jun. 28, 2012

(30) Foreign Application Priority Data

Dec. 27, 2010 (JP) ................. 2010-290888

(51) Int. Cl.
*H01L 29/76* (2006.01)
*H01L 29/94* (2006.01)

(52) U.S. Cl.
USPC ........... 257/402; 257/272; 257/296; 257/299; 257/396; 257/E21.345; 257/E21.427; 257/E21.433; 257/E27.084; 438/202; 438/203

(58) Field of Classification Search
USPC .......... 257/272, 296, 299, 396, 402, E21.345, 257/E21.427, E21.433, E27.084; 438/202, 438/203

See application file for complete search history.

(56) References Cited

U.S. PATENT DOCUMENTS

| 5,675,172 | A | * | 10/1997 | Miyamoto et al. | ............ | 257/402 |
| 6,114,076 | A | * | 9/2000 | Odell et al. | .................... | 525/444 |
| 7,187,033 | B2 | * | 3/2007 | Pendharkar | .................... | 257/339 |
| 2003/0173609 | A1 | * | 9/2003 | Kaneko et al. | ................ | 257/299 |

* cited by examiner

*Primary Examiner* — Dao H Nguyen
(74) *Attorney, Agent, or Firm* — Sughrue Mion, PLLC

(57) ABSTRACT

A semiconductor device is provided, which includes an N well having a peak concentration of $2E+17$ atom/cm$^3$ or more in the range of 0.2 to 1 μm depth from the surface of a P-type semiconductor substrate, and a region provided below the N well, the region containing P-type impurities with higher concentration than concentration of electrons.

19 Claims, 9 Drawing Sheets

SEMICONDUCTOR DEVICE

BACKGROUND OF THE INVENTION

1. Field of the Invention

The present invention relates to a semiconductor device such as a DRAM (Dynamic Random Access Memory), and more particularly to a semiconductor device having an N-type well structure.

2. Description of the Related Art

A representative example of a related art semiconductor device having a triple-well structure is illustrated in FIG. 1. Typically, this semiconductor device has a three-layered structure in which N-type embedded layer 6 is provided on P-type silicon substrate 1 that is manufactured in a CZ method (Czochralski method) and contains boron having a concentration of about $1E+15$ atom/cm$^3$ and oxygen having a concentration of about $1E+18$ atom/cm$^3$, and P-type well (P-well) 3 is further formed thereon. The N-type embedded layer 6 includes two layers of N-well 5 that is deeper than shallow trench isolation (STI) region 2 and Deep-N well 4 that is further deeper than the STI region. This triple-well structure is so featured that NMOS1 forming region of FIG. 1 is covered with the P-well 3, the periphery thereof is covered with the N-well 5 and the Deep-N well 4, and the P-well 3 is formed independently of the P-type silicon substrate 1. Accordingly, in the DRAM, if a transistor of a memory cell portion is formed in NMOS1 forming region, different substrate potentials can be taken from an NMOS (NMOS2) of a peripheral circuit portion and an NMOS of the memory cell portion, and voltage designs of the transistors of the peripheral circuit portion and the memory cell portion can be independently optimized. Further, since the transistor of the memory cell portion is electrically insulated from other elements, noise from the other elements can be blocked. For example, since carriers generated from the peripheral circuit cannot intrude a transistor region of the memory cell portion, data that is maintained in a capacitor connected to the transistor of the memory cell portion is not destroyed. In FIG. 1, numerous signs 7, 8 and 9 denote a gate insulating film, a gate electrode, and a source/drain, respectively. Further, the Deep-N well or the N-well is formed by injecting N-type impurities into a place that is about several microns deep from the surface of the substrate by high-energy ion injection (for example, see FIG. 6).

In a highly integrated device such as a DRAM, electrical insulation (isolation voltage) between the N-type embedded layer 6 and the P-type silicon substrate 1 or between the respective N-type embedded layers 6 as illustrated in FIG. 1 becomes important for device performance. FIG. 2 is a cross-sectional view of a representative DRAM cell transistor portion. For a peripheral circuit portion except for a cell transistor, a general COMS process is used. Here, a well structure related to the present invention will be described using the DRAM cell transistor structure illustrated in FIG. 2. First, a P-type silicon wafer is prepared as P-type semiconductor substrate 21. An active region is surrounded by STI region 22 in which an insulating film is buried, and p-type well 23 to which at least the substrate potential is given and a p-type doped channel layer which determines a threshold voltage of the transistor are formed on the active region. Here, an N-type embedded well layer (Deep-N well) 24 is formed on a lower portion of the p-type well to cover the STI region 22 and all cell transistors. Further, although not illustrated in the drawing, in a region where the Deep-N well 24 is formed, a circuit for sensing data of the cell transistor is mounted in addition to the cell transistor. Further, two gate electrodes 27 are formed on both sides of plug 26 that is connected to DRAM bit line 25, gate insulating film 28 is formed between the gate electrode 27 and the p-type doped channel layer, and side spacers 29 are formed between the gate electrode 27 and the plug 26. In the active region in which the gate electrode 27 is not formed, N-type impurity diffusion layers 30 (LDD) and 31, which become a source and a drain, are formed. The N-type impurity diffusion layers 30 and 31 are in contact with plugs 32 that are connected to a capacitor in addition to the plug 26 connected to the bit line 25. Interlayer insulating film 33 is formed between the plugs. Interlayer insulating film 34 is formed between the plugs 26 and 32 and the bit line 25, and interlayer insulating film 36 is formed between the bit line 25 and capacitor 35. On the capacitor 35, first Al film 37 and second Al film 38 are formed intervening interlayer insulating film 39 as wiring layers. Further, interlayer insulating film 40 is formed between the both Al films. Plasma oxide film 41 is formed on the second Al film of an upper layer as a cover film. Thereafter, in order to hydrogen-terminate the interface state of a gate oxide film interface of the transistor MOS and an STI interface, hydrogen alloying is performed.

The DRAM semiconductor device as described above has several problems. Typically, a CZ substrate contains interstitial oxygen of about $1E+18$ atom/cm$^3$. Since the interstitial oxygen has excessive concentration which is higher than the concentration that can be solubilized at a typical DRAM heat treatment temperature, oxygen cluster (oxygen donor) or oxygen precipitation nuclei (SiOx) is formed through the heat treatment. In a prolonged heat treatment at about 400° C. to 500° C., it is known that the interstitial oxygen is aggregated to act as a donor impurity. For example, if oxygen donors appear through aggregation of oxygen in a boron-doped P-type silicon wafer, the substrate resistance becomes high, and thus carrier electron concentration that is caused by the oxygen donors becomes high in comparison to the amount of boron doping to cause the P-type to be reversed to the N-type. In a highly integrated DRAM for low power consumption, since an excessive heat load that is caused by high-temperature heat treatment is avoided with the miniaturization of transistors, the total processing time for low-temperature heat treatment (400° C. to 500° C.) that causes the generation of the oxygen donors becomes more, and thus the above-described problem becomes severer. FIG. 3A shows the deterioration of well breakdown voltage that is caused by the high resistance of the inside of substrate 51 through generation of the oxygen donors. Since a portion that is deeper than the region of P-type well 53 has high resistance due to low boron concentration, depletion layer 55 is expanded to be connected between adjacent N-wells (Deep-N well 52 and N well 54), and thus leak current (indicated by an arrow) flows therethrough. Further, as illustrated in FIG. 3B, oxygen precipitation nuclei 56 that is generated in the high-temperature process acts as a generation-recombination center if the oxygen precipitation nuclei are present in the depletion layer 55 of a PN junction, and thus abnormal current leakage occurs to cause deterioration of the device characteristics. That is, in the PN junction between the N well and P substrate, which needs to be formed deep in the substrate, the possibility that the oxygen precipitation nuclei are included in the depletion layer is increased. If the current leakage is increased, the power consumption is also increased, and in the worst case, the breakdown voltage between adjacent N wells is lowered to cause device malfunction. Accordingly, in order to prevent the device malfunction by the current leakage between the wells, (1) control of the amount of oxygen donor (and control of boron distribution) that is generated in dependence upon the oxygen concentration in a region below the well and (2)

control of the depth of the top surface of the oxygen precipitation nuclei are required. FIG. 4 shows the result in that the breakdown voltage between adjacent N wells has been changed by low-temperature heat treatment conditions A-C (at 450° C.) that influence the amount of oxygen donor generation and an oxygen concentration condition just below the N well in the case where a DRAM has been actually manufactured. Further, the boron concentration just below the N well is about 1E+15 atom/cm$^3$. As can be seen from the result, as the oxygen concentration just below the N well becomes higher and the heat treatment time at 450° C. becomes longer, the N well breakdown voltage becomes lowered. Further, the shallowest depth of oxygen precipitation nuclei in this experiment is 4 to 5 μm from the substrate surface.

As described above, since the oxygen concentration distribution of the device active region near the substrate surface exerts a bad influence on the device characteristics, there is a method in which an epitaxial silicon layer (hereinafter may be referred to as an "Epi-layer") is thickly provided on the CZ substrate surface as a defect-free layer. However, if the Epi-layer is equal to or thicker than 3 μm, the Epi-layer is formed to be thickly crowded around the rear surface side of the wafer edge, and thus the flatness in the periphery of the wafer is deteriorated. The deterioration of the flatness in the periphery of the wafer causes strict uniformity of the exposure amount in the surface during pattern exposure in manufacturing the current miniaturized device, and thus the good acquisition rate is decreased in the periphery of the wafer. Accordingly, there is a need to solve the above-described problem through the Epi-layer of 3 μm or less. As the Epi-layer becomes thick, the wafer cost is increased. On the other hand, there has been an attempt to reduce the generation amount of oxygen donor or oxygen precipitation nuclei through lowering of the oxygen concentration in the substrate without the Epi-layer or with a thin Epi-layer. Since the oxygen precipitation nuclei in the substrate bring so-called gettering effect for capturing heavy metal contaminants mixed in the device manufacturing process, a certain amount of oxygen precipitation nuclei is needed inside the substrate. Further, COP (Crystal Originating Particles), of which the generation amount is changed by wafer raising conditions, or stacking faults are present in the CZ substrate in addition to the oxygen donors or oxygen precipitation nuclei, and if the CZ substrate is used without the Epi-layer, problems in that the device yield is deteriorated due to the above-described faults have to be solved.

SUMMARY

The present invention provides a semiconductor device and a manufacturing method thereof, which includes a well-forming region and a region below the well-forming region, having optimized P-type impurities and oxygen concentration distribution, in order not to cause yield deterioration due to breakdown voltage drops between wells separated.

According to one embodiment of the present invention, there is provided a semiconductor device, which includes an N well having a peak concentration of 2E+17 atom/cm$^3$ or more in the range of 0.2 to 1 μm depth from the surface of a P-type semiconductor substrate, and a layer for preventing depletion-layer-expansion below the N well, the layer containing P-type impurities with higher concentration than concentration of electrons.

In particular, the P-type impurity concentration of the layer for preventing depletion-layer-expansion is in the range of 2E+15 to 1E+17 atom/cm$^3$, and N-type impurity concentration that is lower than the peak concentration as the range of a shaded portion illustrated in FIG. 7 is provided in the range of 1 μm or more to 4 μm or less from the surface of the P-type semiconductor substrate of the N well.

According to one embodiment of the present invention, since current leakage between wells of a DRAM can be suppressed, a DRAM having high yield, low power consumption, and high reliability can be manufactured.

BRIEF DESCRIPTION OF THE DRAWINGS

The above features and advantages of the present invention will be more apparent from the following description of certain preferred embodiments taken in conjunction with the accompanying drawings, in which:

FIGS. 3A and 3B are schematic views illustrating degradation mechanism of well breakdown voltage, in which FIG. 3A illustrates current leakage between N wells, and FIG. 3B illustrates abnormal leakage due to oxygen precipitation nuclei.

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

First, the construction of a semiconductor device according to the present invention will be described. Here, with respect to FIG. 3 as described above, the effects of the semiconductor device according to the present invention will be described referring to FIG. 5.

Figure 3A:
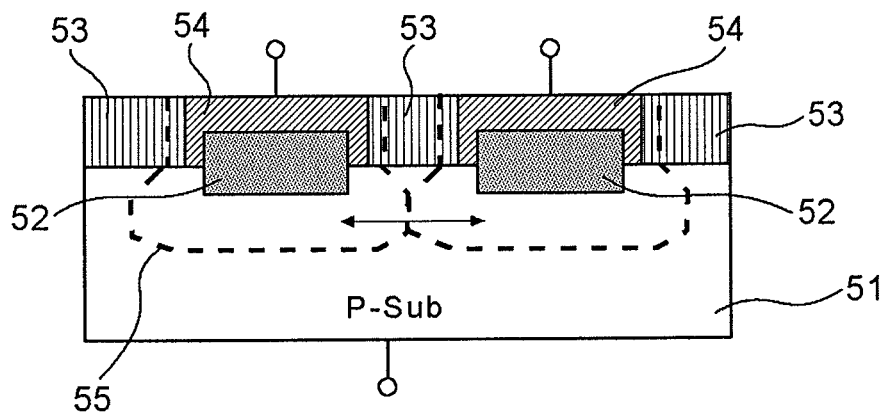
Figure 3B:
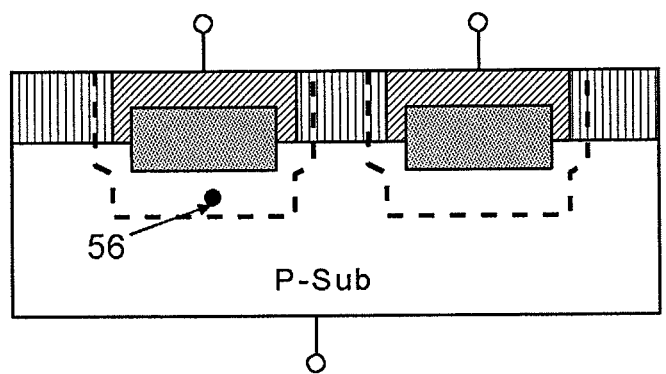
Figure 4:
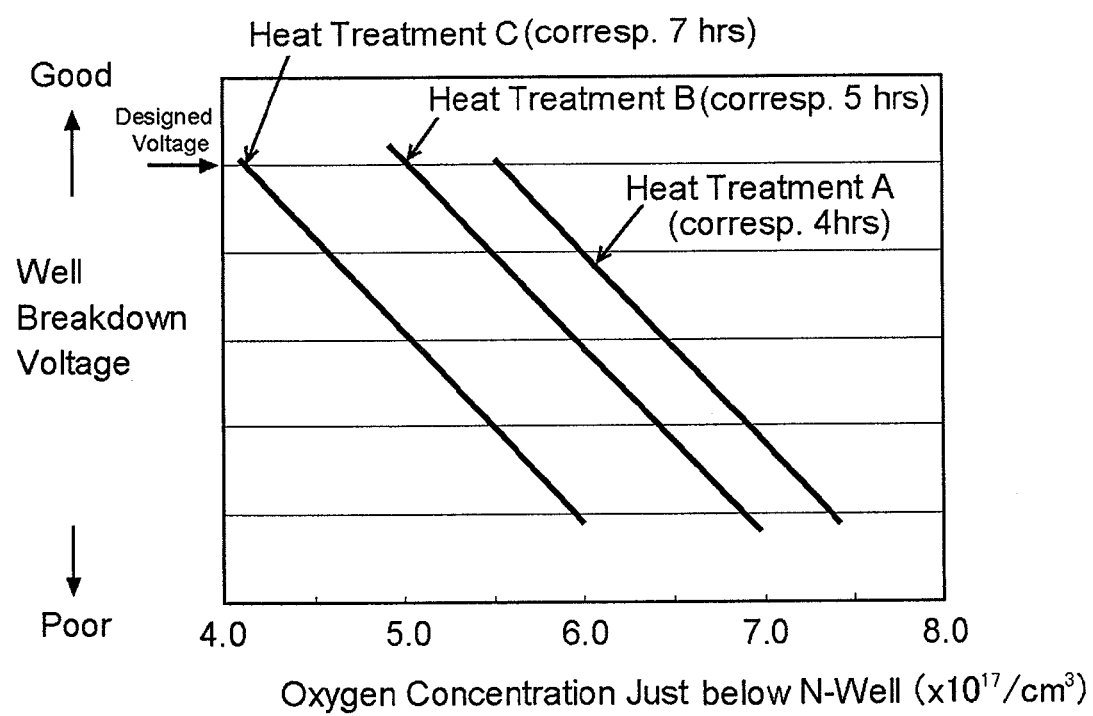
FIG. 4 is a diagram illustrating the relationship of breakdown voltages between wells, which is affected by oxygen concentration and heat treatment. In this diagram, heat treatments A to C correspond to heat treatments at 450° C. for 4, 5 and 7 hours, respectively.
Figure 5A:
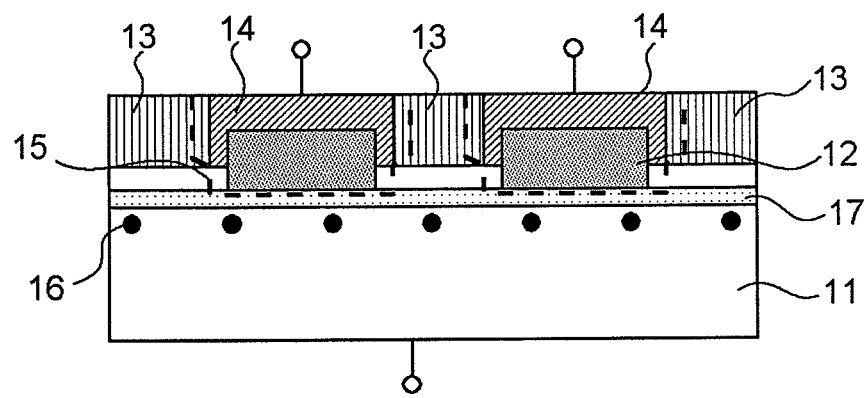
FIGS. 5A and 5B are schematic views illustrating effects of a semiconductor device according to the present invention.
Figure 5B:
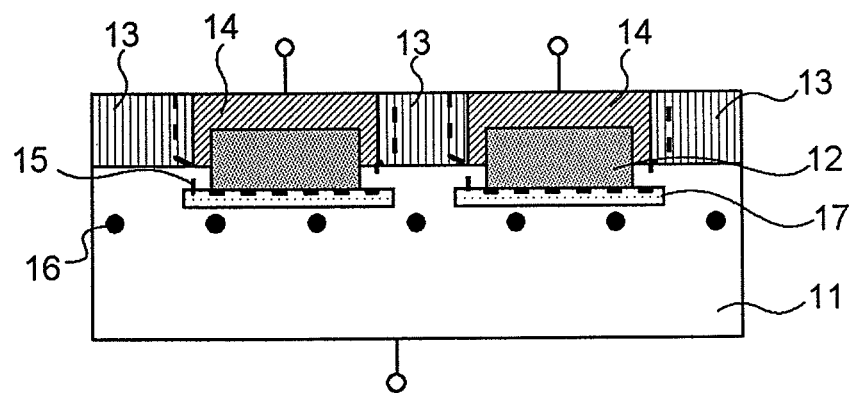

First, FIG. 5 illustrates a case where oxygen precipitation nuclei 16 are actively formed with respect to FIG. 3B, but is not limited thereto. In FIG. 5A, in the same manner as in FIG. 3B, a Deep-N well 12, a P well 13, and an N well 14 are formed on P-type semiconductor substrate 11, and the present invention is different on the point that layer 17 for preventing depletion-layer-expansion is provided below the N well (Deep-N well 12). By providing the layer 17 for preventing depletion-layer-expansion below the N well, depletion layer 15 is suppressed to expand beyond the layer 17 in the substrate 11, and current leakage between N wells as illustrated in FIG. 3A is prevented from occurring. Further, it is also suppressed that the depletion layer 15 is expanded up to the oxygen precipitation nuclei 16 which becomes a gettering site that is formed in the substrate. Further, it is not necessary to continuously form the layer 17 for preventing depletion-layer-expansion in a region that is parallel to the substrate surface as illustrated in FIG. 5A, but the layer 17 for preventing depletion-layer-expansion can be formed discontinuously in a region in which the expansion of the depletion layer 15 can be suppressed as illustrated in FIG. 5B, i.e., it can be formed plurally just below a plurality of the N wells.

Further, the layer 17 for preventing depletion-layer-expansion is not a layer having a clear interface, but means a region in which the expansion of the depletion layer can be functionally prevented.

The layer 17 for preventing depletion-layer-expansion has P-type impurities having higher concentration than the concentration of carrier electrons that are generated by the oxygen donor in the substrate, and for this, the P-type impurities can be injected below the N well, a substrate having high P-type impurity concentration can be used in advance, or carrier electrons generated by the donor can be dispersed in the case where a substrate having a relatively low oxygen concentration is used. The discontinuous layer 17 for preventing depletion-layer-expansion as illustrated in FIG. 5B is formed mainly by injecting the P-type impurities.

Figure 6:
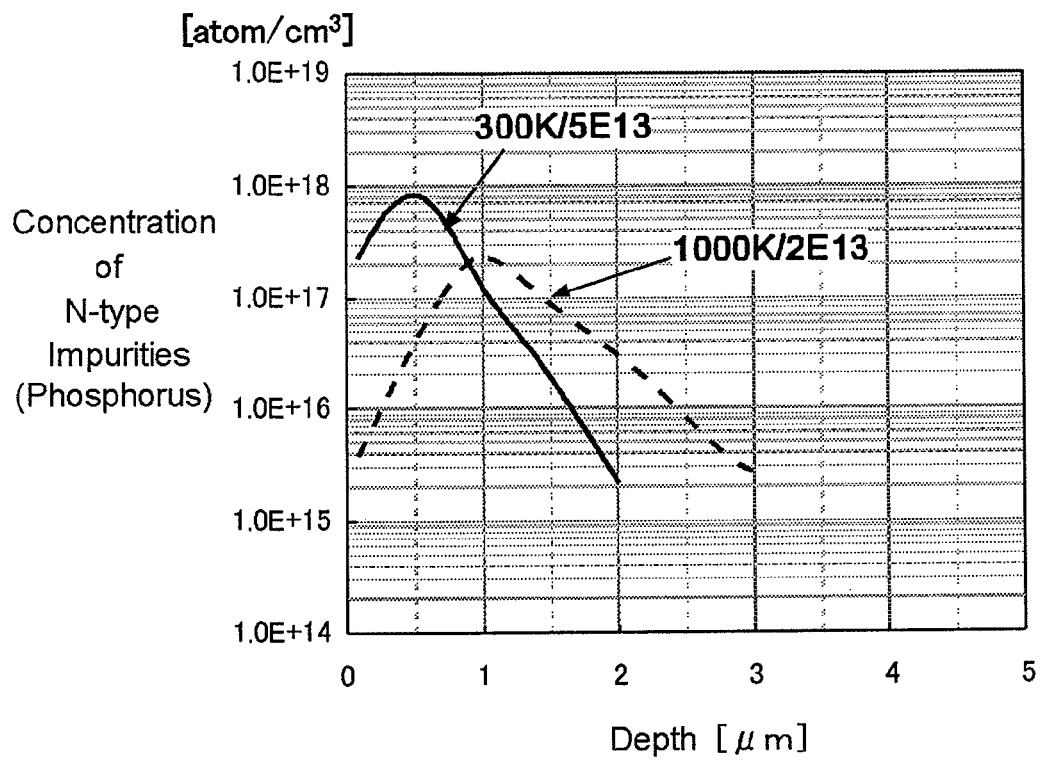
FIG. 6 is a diagram illustrating an example of N-type impurity distribution in Deep-N well and N well.
Figure 7:
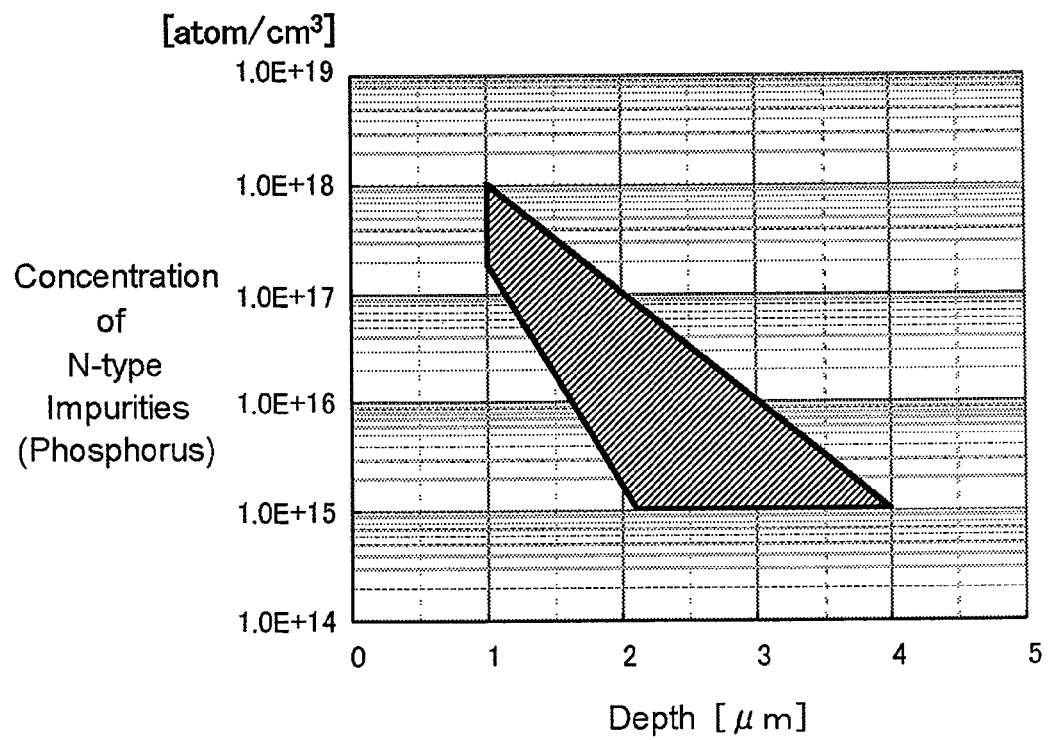
FIG. 7 is a diagram illustrating an N-type impurity distribution region of a region, which is deeper than the peak concentration region, for forming N well according to the present invention.

Further, in the above-described example, a case where the Deep-N well 12 is provided has been described. However, the present invention is not limited thereto, but only the N well may be provided. In the present invention, as described in the following embodiments, it is also preferable to apply a triple-well structure in which a P well is formed in the N well. As illustrated in FIG. 6, the N well has a peak concentration of 2E+17 atom/cm$^3$ or more with a depth in the range of 0.2 to 1 µm from the substrate surface. N-type impurities can be distributed in deeper region than the peak concentration region as shown in FIG. 7. In FIG. 7, a region in the range of 1 µm to 4 µm depth is shown, but the present invention is not limited to this region.

Hereinafter, embodiments of the present invention will be described in detail. However, the present invention is not limited to those embodiments.

Embodiment 1

Figure 11:
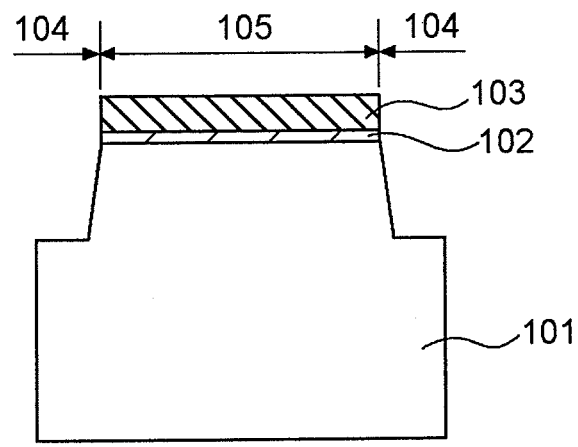
FIGS. 11 to 15 are process cross-sectional views illustrating a method of manufacturing a cell transistor of a DRAM according to a first embodiment.

First, P-type silicon wafer 101, on which an epitaxial silicon layer is grown with a thickness of 1 to 3 µm as a defect-free layer, is prepared on the surface of a CZ substrate having boron concentration of about 1E+15 atom/cm$^3$ and oxygen concentration of about 8E+17 to 13E+17 atom/cm$^3$. In order to achieve the oxygen concentration distribution illustrated as a shaded portion in FIG. 8, the oxygen in the CZ substrate is diffused into the epitaxial layer with the silicon epitaxial growth. Here, in order to achieve the distribution illustrated in FIG. 8, additional heat treatment for diffusing oxygen can be performed. Thereafter, thermal oxide film 102 is formed with a thickness of 5 nm at 850° C., and silicon nitride film 103 is formed thereon with a thickness of 40 nm at 750° C. through a thermal CVD method. In this film deposition process, oxygen precipitation nuclei are generated in a region that is deeper than the substrate surface for about 4 to 5 µm. This heat treatment for generating the oxygen precipitation nuclei can be performed as an additional heat treatment process, and in this case, the heat treatment can include heat treatment for about three hours at 850° C. and heat treatment for about five hours at 750° C. The formed oxygen precipitation nuclei are significantly grown by the following heat treatment for forming a device. Photoresist (not illustrated) is coated on a laminated film of the thermal oxide film 102 and the nitride film 103, and a resist pattern for opening shallow trench isolation (STI) region 104 is formed by a conventionally known photolithography method. Thereafter, the laminated film of the thermal oxide film 102 and the nitride film 103 and the silicon substrate are etched by dry etching using the resist pattern as a mask (FIG. 11).

Figure 12:
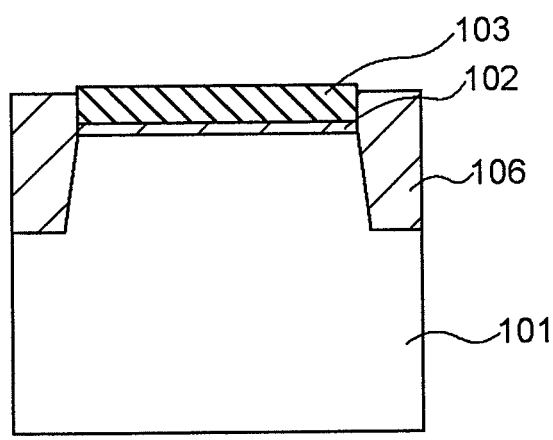

Then, a thermal oxidation film (not illustrated) with a thickness of about 5 nm is formed by performing thermal oxidation of the silicon in the exposed STI region 104, and then a CVD oxide film is deposited on the entire surface and planarized by CMP to form element isolation insulating film 106 (FIG. 12).

Figure 13:
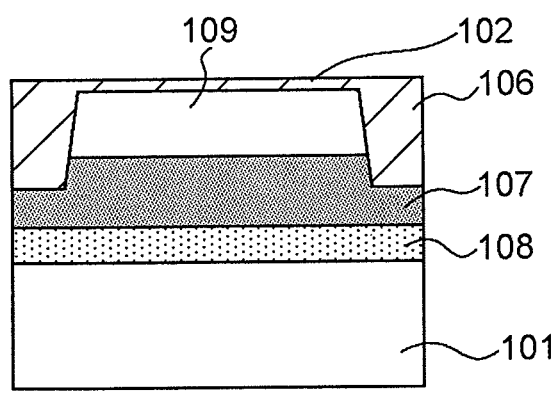

After the nitride film 103 used as a mask is removed, phosphorus injection is performed with injection energy of 1000 kV and a dose amount of 3.0E+13 atom/cm$^2$, and at an injection angle of 7 degrees, as the Deep-N well injection, to form embedded N layer 107. Here, boron is injected just below the Deep-N well as a layer for preventing depletion-layer-expansion 108. The boron injection is performed with 1000 kV and a dose amount of 1E+12 atom/cm$^2$. Thereafter, in order to form P well 109, boron injection is performed three times, that is, with 300 keV and 1E+13 atom/cm$^2$, with 150 keV and 5E+12 atom/cm$^2$, and with 50 keV and 1E+12 atom/cm$^2$, respectively, and then heat treatment for 5 minutes is performed (FIG. 13).

Figure 14:
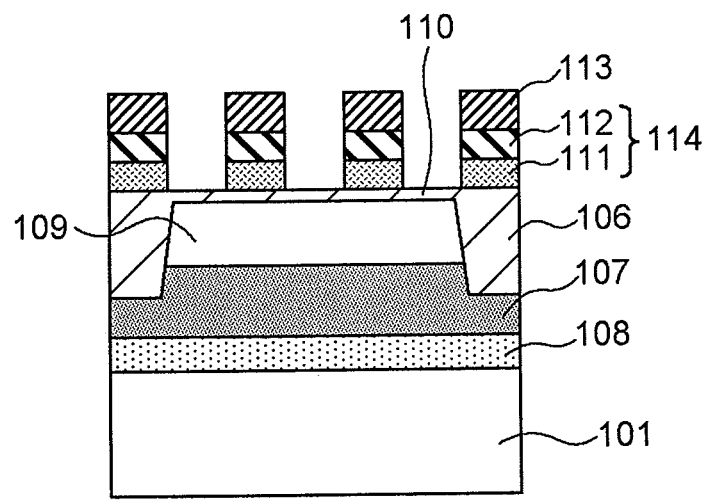

Thereafter, as illustrated in FIG. 14, after removing the thermal oxide film 102 that covers the substrate surface when boron for forming the P well is injected, gate oxide film 110 is formed with a film thickness of 5 nm by a thermal oxidation method, and then a material that will become gate electrode 114 is additionally deposited and processed. The gate electrode material has a lower portion that is polycrystalline silicon film 111 doped with phosphorous in high concentration and with a film thickness of 50 nm and an upper portion that is a laminated film of a tungsten nitride film and a tungsten film (WN/W film 112). Further, silicon nitride film 113 is formed on the tungsten film with a film thickness of 150 nm. The gate electrode 114 is formed by patterning the gate electrode material using the silicon nitride film 113 as a mask.

Figure 15:
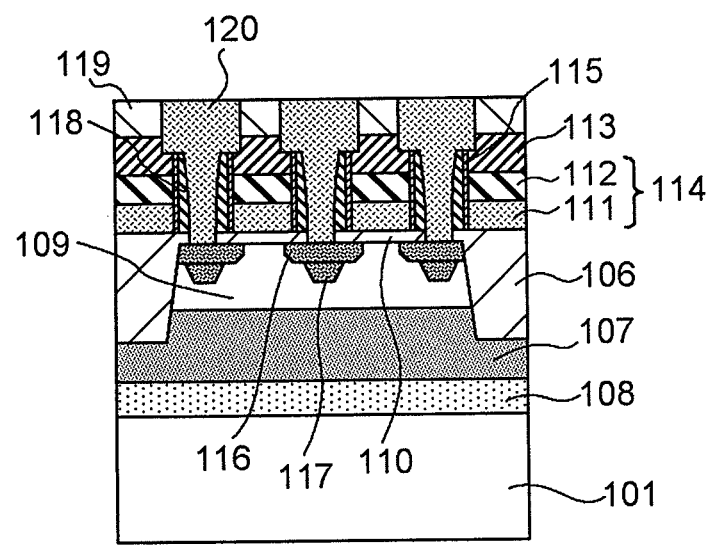

Thereafter, as illustrated in FIG. 15, in order to protect the side surfaces of the polycrystalline silicon film 111 and the WN/W film 112 that will become the gate electrode 114, a silicon nitride film 115 is formed with a thickness of 5 nm. Then, in order to form an N-type LDD layer 116 that will become a source/drain, phosphorous injection is performed. The phosphorous injection condition may be 10 keV and 1E+13 atom/cm$^2$. Thereafter, heat treatment for 10 seconds at 1000° C. is performed.

A silicon nitride film is formed with a film thickness of 10 nm as sidewall 118, and then, a silicon oxide film is deposited with a thickness of 300 nm as a first interlayer insulating film 119. Thereafter, the first interlayer insulating film 119 is planarized using a typical planarization method, and a hole for forming a plug is formed by etching the first interlayer insulating film 119 and the sidewall 118 in order. Alternatively, the hole can be formed by a self-alignment contact method using the sidewall 118 as a mask. Here, phosphorous injection for electric field relaxation and arsenic injection for reduction of diffusion layer resistance are performed so as to form high concentration diffusion layer 117. First, the phosphorous injection is performed with 30 keV and 1E+13 atom/cm$^2$, and the arsenic injection is performed with 20 keV and 1E+13 atom/cm$^2$.

Figure 1:
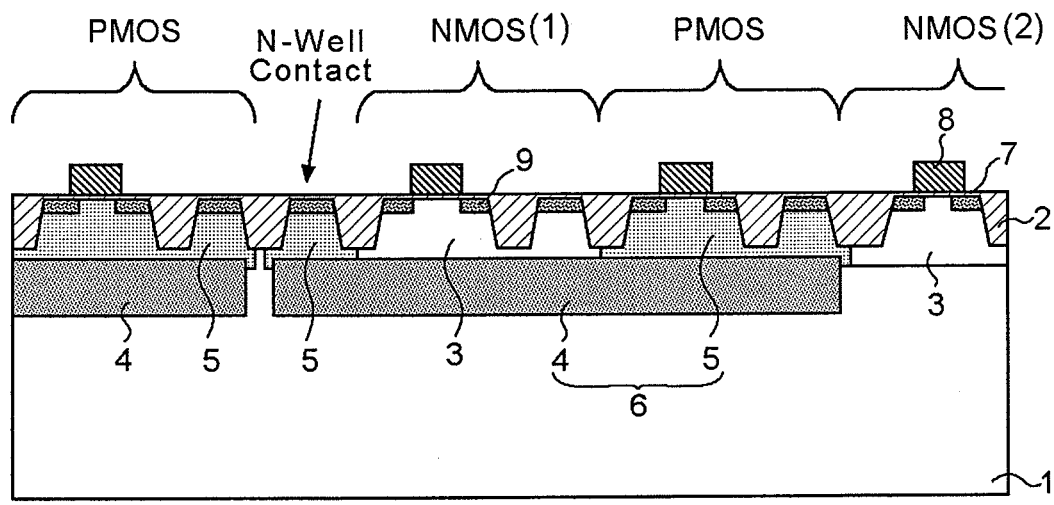
FIG. 1 is a schematic cross-sectional view illustrating a triple-well structure.
Figure 2:
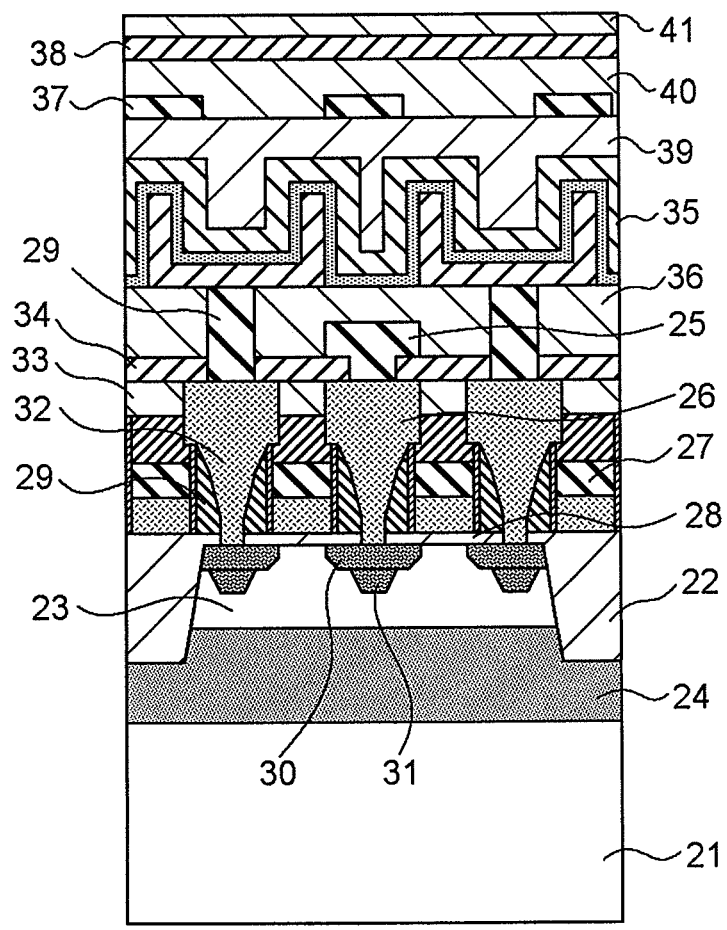
FIG. 2 is a schematic cross-sectional view illustrating a DRAM cross-sectional structure (cell transistor portion).
Figure 10:
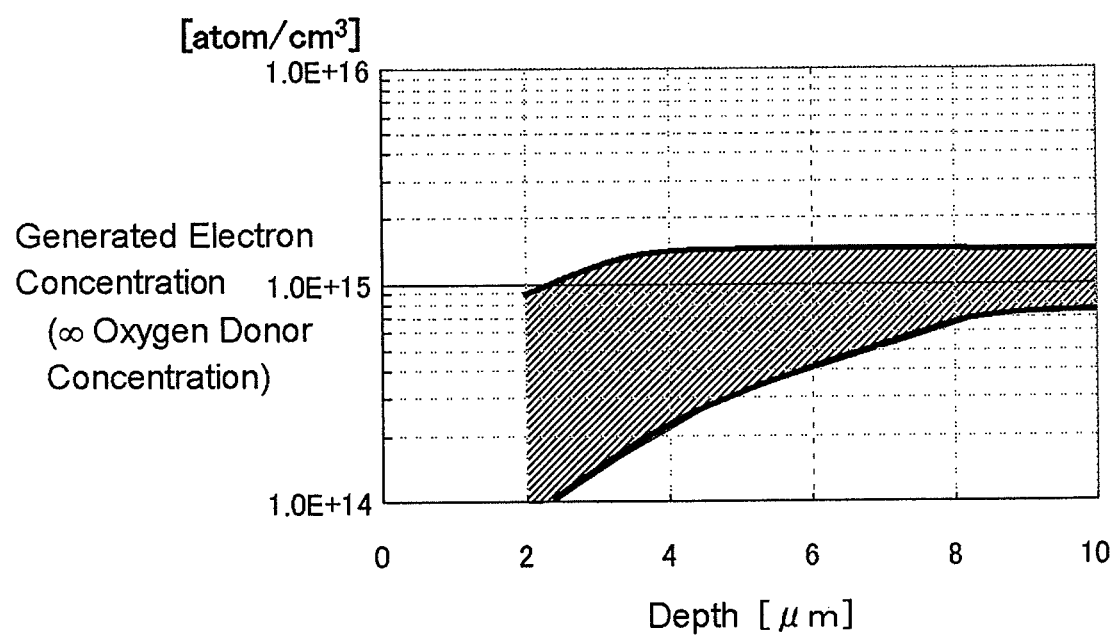
FIG. 10 is a diagram illustrating an example of an electron concentration distribution region occurring in a manufacturing process according to the present invention.

Further, polycrystalline silicon plug 120 that is phosphorous-doped with high concentration is buried in the hole for forming the plug. Thereafter, deposition of a silicon oxide film with the film thickness of 100 nm, formation of storage node contacts, formation of capacitors including cylinder forming, two-layered Al wiring processes or the like are performed. Thereafter, a hydrogen alloying process for terminating the interface state is performed for two hours at 450° C. As a result, a DRAM cell structure as illustrated in FIG. 2 is complicated. Since in the above-described DRAM manufacturing processes, although the details are omitted, impurity activation heat treatment or heat treatment at about 700° C. to 1000° C. is performed through a deposition process by a CVD method, the oxygen precipitation nuclei are grown as the processes undergo. Further, in the DRAM process, the heat treatment of 400° C. to 500° C. can be performed for deposition by plasma CVD or hydrogen alloying. As the processes undergo, the oxygen donors or the oxygen precipitation nuclei are grown, and carrier electrons are generated as shown in FIG. 10. However, device degradation is prevented from occurring by the layer for preventing depletion-layer-expansion.

Figure 8:
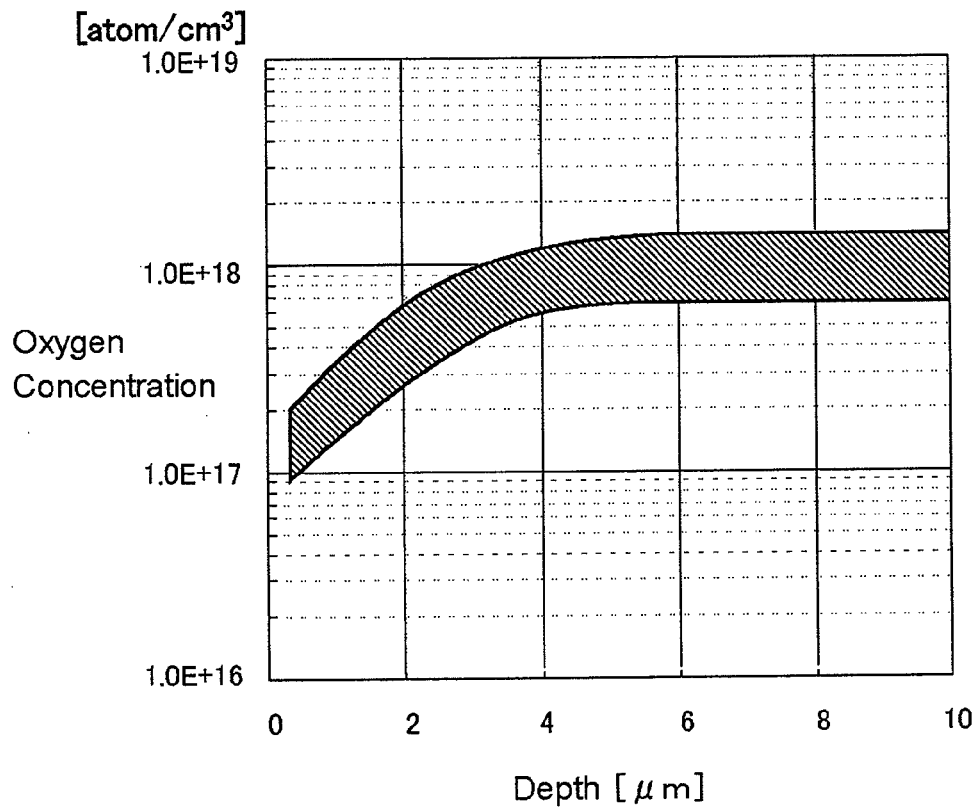
FIG. 8 is a diagram illustrating an example of an oxygen concentration distribution region according to the present invention.

In order to perform gettering of heavy metal contaminants that are mixed during the heat treatment in the device process or assembling process, the oxygen precipitation nuclei are required. As illustrated in FIG. 8, at the substrate depth of about 4 to 5 μm that is deeper than a device fabrication region, it is preferable that the oxygen concentration is about 7E+17 to 13E+17 atom/cm$^3$, and in the heat treatment process at 700° C. to 900° C. in the device process, oxygen precipitation nuclei are generated. Further, in the device fabrication region, control is performed so that the oxygen concentration is lowered, and the generation of the oxygen precipitation nuclei at the substrate surface (shallower depth) is suppressed. Further, the electron density distribution that is caused by the oxygen donor generation is as shown in FIG. 10 through the heat treatment at 400° C. to 500° C. in the DRAM manufacturing process. Here, in order to encounter high resistance through the generated electron concentration and to prevent the oxygen precipitation nuclei from being included in the depletion layer that extends to the lower portion of the N well, the layer for preventing depletion-layer-expansion is prepared. In this prevention layer, boron with higher concentration than the electron concentration, for example, with concentration of about 2E+15 to 1E+17 atom/cm$^3$, is contained. Here, in order to prevent the depletion layer contact between the N wells as illustrated in FIG. 3A, it is preferable that the concentration of boron becomes higher. However, if the concentration of boron becomes too high, the junction electric field is strengthened, and thus the intrinsic junction breakdown voltage is decreased. Accordingly, it is preferable to contain boron with concentration of 3E+15 to 8E+15 atom/cm$^3$.

Embodiment 2

Figure 9:
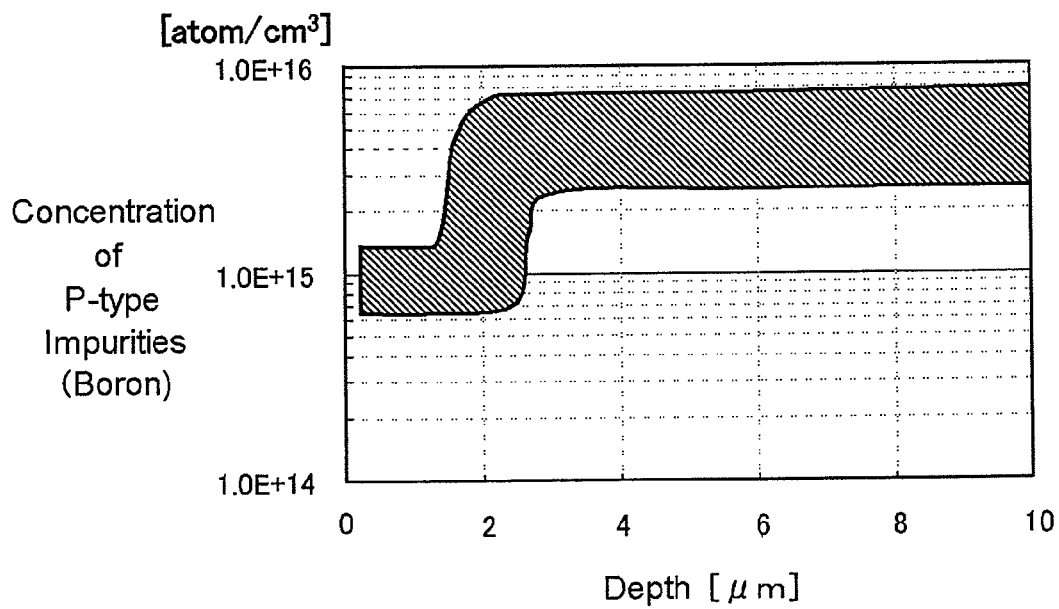
FIG. 9 is a diagram illustrating an example of a P-type impurity distribution region according to the present invention.

First, a silicon wafer, on which an Epi-layer having boron concentration of about 1E+15 atom/cm$^3$ is formed with a thickness of 1 to 3 μm, is manufactured on the surface of a CZ substrate having boron concentration of about 3E+15 to 8E+15 atom/cm$^3$ and oxygen concentration of about 8E+17 to 13E+17 atom/cm$^3$, and a DRAM is manufactured on the wafer surface by the DRAM process according to Embodiment 1. FIG. 9 is a diagram illustrating a P-type impurity (boron) distribution region according to this embodiment. In Embodiment 1, in order to form the layer for preventing depletion-layer-expansion just below the Deep-N well, boron injection is performed. By contrast, in this embodiment, a high-energy injection process is not required, and thus the DRAM manufacturing cost is lowered. Further, even if the boron concentration in the CZ substrate is about 2E+15 to 3E+15 atom/cm$^3$ or about 9E+15 to 1E+17 atom/cm$^3$, there is no problem in the device characteristics. However, since the well breakdown voltage is slightly lowered, the above-described range is preferable. Further, the boron concentration of the Epi-layer can be less than 1E+15 atom/cm$^3$.

Embodiment 3

First, on the surface of a CZ substrate having boron concentration of about 1E+15 atom/cm$^3$ and oxygen concentration of about 9E+17 atom/cm$^3$ or less, a DRAM is manufactured by the DRAM process according to Embodiment 1. In this case, the boron injection process for forming the layer for preventing depletion-layer-expansion that is performed in Embodiment 1 is not performed. However, heat treatment at 600° C. to 700° C. is added just before the DRAM device manufacturing is finished. By this heat treatment, oxygen donor that is generated during the heat treatment at 400° C. to 500° C. disappears, and the boron concentration in the semiconductor substrate just below the N well becomes apparently higher to prevent the expansion of the depletion layer. That is, the semiconductor substrate that is just below the N well becomes the layer for preventing depletion-layer-expansion having higher boron concentration than the carrier electron concentration.

According to the present invention, since the power consumption is suppressed without deteriorating the manufacturing yield, it is possible to manufacture a high-integration DRAM device at low cost, and thus the device can be used as a DRAM that is used in a PC server or a portable terminal.

The present invention includes the following aspects:

I. A method of manufacturing a semiconductor device comprising:
  preparing a P-type semiconductor substrate;
  forming an N well having a peak concentration of 2E+17 atom/cm$^3$ or more in the range of 0.2 to 1 μm depth from the surface of the P-type semiconductor substrate by injecting N-type impurities onto the substrate; and
  forming a layer for preventing depletion-layer-expansion below the N well, the layer containing P-type impurities with higher concentration than concentration of carrier electrons generated in the P-type semiconductor substrate in a manufacturing process.

II. The method of manufacturing a semiconductor device as described in I, wherein the layer for preventing depletion-layer-expansion is formed so that the P-type impurity concentration thereof is in the range of about 2E+15 to 1E+17 atom/cm$^3$.

III. The method of manufacturing a semiconductor device as described in I or II, wherein the process of preparing the P-type semiconductor substrate comprises growing an epitaxial silicon layer on a CZ substrate surface with a thickness of 1 to 3

IV. The method of manufacturing a semiconductor device as described in III, wherein the process of preparing the P-type semiconductor substrate comprises diffusing interstitial oxygen in the CZ substrate into the epitaxial silicon layer, and forming a profile in which oxygen concentration is decreased from the vicinity of an interface between the CZ substrate and the epitaxial silicon layer toward the surface of the P-type semiconductor substrate.

V. The method of manufacturing a semiconductor device as described in III or IV, wherein the layer for preventing depletion-layer-expansion is formed by injecting P-type impurities into a region that is deeper than the N well after forming the N well using the CZ substrate having the P-type impurity concentration of 1E+15 atom/cm$^3$ and oxygen concentration of 8E+17 to 13E+17 atom/cm$^3$.

VI. The method of manufacturing a semiconductor device as described in III or IV, wherein the layer for preventing depletion-layer-expansion is formed by forming an epitaxial silicon layer having the P-type impurity concentration of 1E+15 atom/cm$^3$ or less using the CZ substrate having the P-type impurity concentration of about 3E+15 to 8E+15 atom/cm$^3$ and oxygen concentration of about 8E+17 to 13E+17 atom/cm$^3$.

VII. The method of manufacturing a semiconductor device as described in I, wherein the process of preparing the P-type semiconductor substrate is a process of preparing a CZ substrate having the P-type impurity concentration of about 1E+15 atom/cm$^3$ and oxygen concentration of about 9E+17 atom/cm$^3$ or less, and the layer for preventing depletion-layer-expansion is formed by performing a heat treatment process at 600° C. to 700° C. in the final stage of manufacturing the semiconductor device.

VIII. The method of manufacturing a semiconductor device as described in I to VII, wherein the manufacturing process includes a heat treatment process for generating oxygen donor at 400 to 500° C.

IX. The method of manufacturing a semiconductor device as described in I to VIII, wherein the manufacturing process includes a heat treatment process for precipitating oxygen in the P-type semiconductor substrate as oxygen precipitation nuclei at 700 to 900° C.

X. The method of manufacturing a semiconductor device as described in I to IX, further comprising forming a P well in the N well.

XI. The method of manufacturing a semiconductor device as described in X, further comprising forming an NMOS transistor for a memory cell on the P well, and forming a capacitor that is electrically connected to the NMOS transistor.

What is claimed is:

1. A semiconductor device comprising:
   an N well having a peak impurity concentration of 2E+17 atom/cm$^3$ or more in the range of 0.2 µm to 1 µm depth from the surface of a P-type semiconductor substrate; and
   a layer for preventing depletion-layer-expansion below the N well, the layer containing P-type impurities with higher concentration than concentration of carrier electrons generated in the P-type semiconductor substrate.

2. The semiconductor device according to claim 1, wherein the P-type impurity concentration of the layer for preventing depletion-layer-expansion is in the range of about 2E+15 to 1E+17 atom/cm$^3$.

3. The semiconductor device according to claim 2, wherein the P-type impurity is boron.

4. The semiconductor device according to claim 1, wherein N-type impurity concentration that is lower than the peak concentration as the range of a shaded portion illustrated in FIG. 7 is provided in the range of 1 µm or more to 4 µm or less from the surface of the P-type semiconductor substrate located the N well.

5. The semiconductor device according to claim 1, wherein oxygen precipitation nuclei based on interstitial oxygen in the substrate are provided as gettering sites in a region that is separated from the N well by the layer for preventing depletion-layer-expansion in the P-type semiconductor substrate.

6. The semiconductor device according to claim 1, wherein the semiconductor substrate has a triple-well structure having a P well in the N well.

7. The semiconductor device according to claim 6 wherein a memory cell is formed on the P well of the triple-well structure.

8. The semiconductor device according to claim 7, wherein the memory cell has an NMOS transistor formed on the P well, and a capacitor that is electrically connected to the NMOS transistor.

9. The semiconductor device according to claim 1, wherein the P-type semiconductor substrate is a silicon wafer that is obtained by forming an epitaxial silicon layer on a CZ substrate.

10. The semiconductor device according to claim 9, wherein the epitaxial silicon layer has a thickness in the range of 1 to 3 µm.

11. The semiconductor device according to claim 10, wherein the CZ substrate has P-type impurity concentration of about 1E+15 atom/cm$^3$ and oxygen concentration of about 8E+17 to 13E+17 atom/cm$^3$ and the epitaxial silicon layer is formed without doping.

12. The semiconductor device according to claim 11, wherein the layer for preventing depletion-layer-expansion is formed by injecting P-type impurities into the substrate.

13. The semiconductor device according to claim 10, wherein the CZ substrate has P-type impurity concentration of about 3E+15 to 8E+15 atom/cm$^3$ and oxygen concentration of about 8E+17 to 13E+17 atom/cm$^3$ and the epitaxial silicon layer is formed with doping P-type impurities in concentration of about 1E+15 atom/cm$^3$ or less.

14. The semiconductor device according to claim 9, wherein the layer for preventing depletion-layer-expansion includes a defect-free layer that is formed in the epitaxial silicon layer.

15. The semiconductor device according to claim 9, wherein a profile of the oxygen concentration is decreased from the vicinity of an interface between the CZ substrate and the epitaxial silicon layer toward the surface of the P-type semiconductor substrate.

16. The semiconductor device according to claim 1, wherein the carrier electron concentration is concentration of carrier electrons that are generated by oxygen donor in the substrate during a manufacturing process of the semiconductor device.

17. The semiconductor device according to claim 1, wherein the P-type semiconductor substrate is a CZ substrate having the P-type impurity concentration of about 1E+15 atom/cm$^3$ and oxygen concentration of about 9E+17 atom/cm$^3$ or less, and the carrier electrons generated in the P-type semiconductor substrate are lost in the final stage of manufacturing the semiconductor device.

18. The semiconductor device according to claim 1, wherein the layer for preventing depletion-layer-expansion is provided plurally just below a plurality of the N wells.

19. The semiconductor device according to claim 1, wherein the layer for preventing depletion-layer-expansion is provided continuously below a plurality of the N wells.

* * * * *